US008818773B2

(12) United States Patent
Eugene et al.

(10) Patent No.: US 8,818,773 B2
(45) Date of Patent: Aug. 26, 2014

(54) EMBROIDERY IMAGE RENDERING USING PARAMETRIC TEXTURE MAPPING

(75) Inventors: Hsu Eugene, Somerville, MA (US); Goldman A. David, Bedford, MA (US)

(73) Assignee: Vistaprint Schweiz GmbH, Winterthur (CH)

( * ) Notice: Subject to any disclaimer, the term of this patent is extended or adjusted under 35 U.S.C. 154(b) by 8 days.

(21) Appl. No.: 12/911,521

(22) Filed: Oct. 25, 2010

(65) Prior Publication Data

US 2012/0101790 A1 Apr. 26, 2012

(51) Int. Cl.
*G06T 11/00* (2006.01)
*G06F 17/50* (2006.01)

(52) U.S. Cl.
CPC .............. *G06T 11/001* (2013.01); *G06F 17/50* (2013.01)
USPC .............................................. 703/6; 345/582

(58) Field of Classification Search
CPC ...... G06F 17/50; D05B 19/08; D05B 19/085; D05B 19/10; D05B 19/105; D05C 5/00
USPC .............. 700/138; 703/6; 345/418, 441, 582, 345/583, 588; 705/27.2
See application file for complete search history.

(56) References Cited

U.S. PATENT DOCUMENTS

| 5,009,943 | A | * | 4/1991 | Stahl | 428/40.6 |
|---|---|---|---|---|---|
| 5,668,730 | A | * | 9/1997 | Tsonis et al. | 700/138 |
| 7,088,374 | B2 | | 8/2006 | David et al. | |
| 7,271,811 | B2 | * | 9/2007 | Drucker et al. | 345/588 |
| 2004/0056871 | A1 | | 3/2004 | Milliron | |
| 2005/0149223 | A1 | * | 7/2005 | Takeuchi | 700/138 |
| 2006/0061585 | A1 | | 3/2006 | Drucker et al. | |
| 2007/0118245 | A1 | * | 5/2007 | Goldman et al. | 700/138 |
| 2008/0079727 | A1 | * | 4/2008 | Goldman et al. | 345/441 |
| 2009/0249841 | A1 | | 10/2009 | Holmes | |
| 2009/0286039 | A1 | * | 11/2009 | Weedlun et al. | 428/114 |
| 2010/0106283 | A1 | | 4/2010 | Harvill et al. | |
| 2011/0157226 | A1 | | 6/2011 | Ptucha et al. | |

(Continued)

FOREIGN PATENT DOCUMENTS

| EP | 1500735 | 1/2005 |
|---|---|---|
| EP | 1676945 | 7/2006 |

OTHER PUBLICATIONS

Notification of Transmittal of the International Search Report and the Written Opinion of the International Searching Authority, or the Declaration, mailed on Jul. 25, 2012 for International Application No. PCT/US2011/042608.

(Continued)

*Primary Examiner* — Kamini S Shah
*Assistant Examiner* — Jay B Hann
(74) *Attorney, Agent, or Firm* — Jessica Costa

(57) ABSTRACT

Rendering methods, systems, and computer-readable media for rendering a simulated embroidery design image based on an embroidery design are presented. Given an embroidery design comprising a plurality of stitch representations and a lighting angle for the simulated embroidery design image, embodiments process the stitch representations to determine a stitch length and lighting angle and select from a stitch image database a stitch image corresponding to the stitch length and lighting angle, and place the selected stitch on a rendering canvas in a position corresponding to the stitch position indicated by the stitch representation. When rendered, all of individual stitch image on the rendering canvas appear to be illuminated from the same direction.

19 Claims, 12 Drawing Sheets

(56) References Cited

U.S. PATENT DOCUMENTS

| | | |
|---|---|---|
| 2011/0170800 A1 | 7/2011 | Curlander et al. |
| 2012/0256948 A1 | 10/2012 | Fermin et al. |
| 2012/0259727 A1 | 10/2012 | Fermin et al. |
| 2013/0335437 A1 | 12/2013 | Lynn et al. |

OTHER PUBLICATIONS

"Notification of Transmittal of the International Search Report and the Written Opinion of the International Searching Authority, or the Declaration," mailed Aug. 3, 2012 for International Application No. PCT/US2012/033104.

"Notification of Transmittal of the International Search Report and the Written Opinion of the International Searching Authority, or the Declaration," mailed Jul. 25, 2012 for International Application No. PCT/US2012/033096.

Ding, et al., "Semi-Automatic Image Personalization Tool for Variable Text Insertion and Replacement," Proceedings of the International Society for Optical Engineering SPIE, vol. 7540, pp. 1-11, XP-002678817, 2010.

Final Office Action dated Oct. 29, 2013 for U.S. Appl. No. 13/084,550.

Gilmours Wholesale Food & Beverage, "Webshot Help and Frequently Asked Questions," Retrieved from the Internet: URL: https://www.gilmours.co.nz/content/frequently_asked_questions.pdf, 5 pages, updated Mar. 22, 2011.

Office Action dated Jan. 17, 2013 for U.S. Appl. No. 13/084,550.

Wauters, "DAZZ Offers a Way to Preview PhotoGifts Prior to Purchase," http://techcrunch.com; Feb. 28, 2009, Retrieved from the Internet: URL: http://techcrunch.com/2009/02/28/dazz-offers-a-way-to-preview-photo-gifts-prior-to-purchase/.

White et al., "Retexturing Single Views Using Texture and Shading," Computer Vision-ECCV 2006, Part IV, Lecture Notes in Computer Science 3954, pp. 70-81, Jan. 1, 2006.

Yen, et al., "Web-Based Virtual Reality Catalog in Electronic Commerce," Proceedings of the 33rd Hawaii International Conference on System Sciences, pp. 1-10, Jan. 4-7, 2000.

* cited by examiner

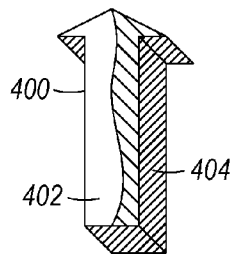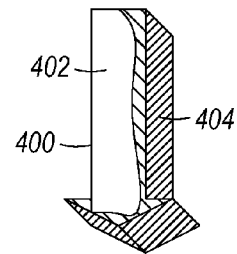
FIG. 4A    FIG. 4C
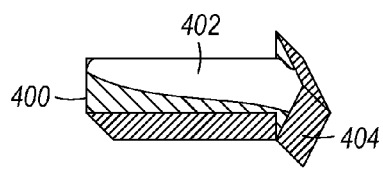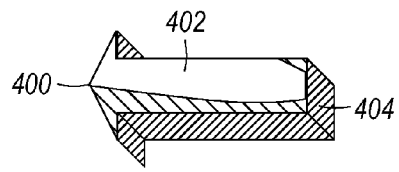
FIG. 4B    FIG. 4D
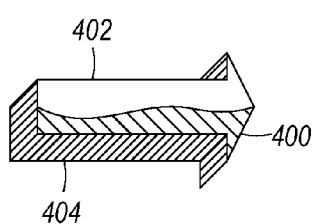
FIG. 5

EMBROIDERY IMAGE RENDERING USING PARAMETRIC TEXTURE MAPPING

BACKGROUND OF THE INVENTION

The present invention relates generally to generating computer images of embroidered stitching, and more particularly image rendering of embroidered images using parametric texture mapping.

Embroidery is the art of applying decorative threaded designs to fabric or textiles. In machine embroidery, embroidery designs are stitched with an automated embroidery machine. These designs are digitized into a sequence of embroidery primitives with embroidery software, and then converted to individual stitches using a stitch engine. Methods, systems, and techniques for computer-assisted embroidery are described in U.S. Pat. No. 6,836,695 to Goldman, U.S. Pat. No. 7,016,756 to Goldman, U.S. Pat. No. 6,947,808 to Goldman, U.S. Pat. No. 7,016,757 to Goldman, U.S. Pat. No. 7,587,256 to Goldman, U.S. Pat. No. 6,804,573 to Goldman, U.S. Pat. No. 6,397,120 to Goldman, U.S. Patent Application Publication No. US 2010-0191364 A1 to Goldman, U.S. Patent Application Publication No. US 2007-0118245 A1 to Goldman et al., U.S. Patent Application Publication No. US 2010-0017011 A1 to Goldman et al., U.S. Patent Application Publication No. US 2008-0079727 A1 to Goldman et al., each of which is incorporated by reference herein for all that they teach.

Embroidered products may be viewed and purchased at various websites accessible through the Internet. In order to ensure customer satisfaction with their received embroidered product, and in particular to ensure that what the customer receives is how it looked when the customer viewed it at order time, it is desirable to present a realistic preview image of the physical embroidery on the customer's computer display. In many instances, the vendor of the embroidered products does not embroider a product before the product is ordered. In these instances, there may not be an image available (e.g., a picture image of the actual embroidered product) to present to the user. It may therefore be desirable to generate a realistic rendering of an embroidered product in software that accurately represents what the embroidery will look like when manufactured.

Most computerized embroidery systems provide some sort of previewing system. The simplest methods draw each stitch with a simple colored line. More sophisticated systems may model a stitch and color it using one of several common shading algorithms to simulate depth and lighting by depicting differing levels of darkness.

One realization of this model-and-color approach is described in U.S. Patent Application Publication US2010/0106283 A1 (hereinafter referred to as the "283 Publication"), which is incorporated by reference herein for all that it teaches. The '283 Publication describes an embroidery system and method in which a consumer can provide a design, such as images or text, have it converted into a digitized image and then used to generate customized embroidery that can be placed onto a product. The '283 Publication also describes an embroidery simulation that shows the translated embroidery design using the embroidered textures and colors placed by an artisan. The embroidery simulation demonstrates to the user how the embroidery machine might execute the stitch instructions implicit in an embroidery design, and displays the simulated image of the design to the user. The embroidery simulation algorithm described in the '283 Publication utilizes a set of Normal Maps that contain geometric information about the object, in this case a thread stitch. To render these Normal Maps, a simple shading model appears to be used, such as a Phong shading model which models surface reflection of light based on a combination of diffuse reflection of rough surfaces with the specular reflection of shiny surfaces and factoring in the ambient light to account for light scatter.

The embroidery simulation described in the '283 Publication is an embodiment of a traditional model-and-color rendering technique which colors a three-dimensional model of an object according to its material properties and lighting. To render embroidery using this approach, it is necessary to model the geometry of thread down to the twist level. However, the achievable realism using this approach is limited for a variety of reasons.

First, the geometrical accuracy of the '283 Publication approach is limited in that while it is relatively easy to model the individual twists in a piece of thread, it is much more difficult to account for the fact that each twist is made up of many smaller fibers with random feathering. Modeling a thread as solid twists is conceptually as inaccurate as modeling a piece of cloth as a perfectly flat sheet of plastic.

Second, even if provided with accurate geometry at the microscopic level, there are many practical limitations to how precisely the interaction of light can be simulated. In the model-and-color approach, the model is colored using a shading algorithm. Most shading models do not account for effects such as subsurface scattering and global illumination, both of which are visible in photographs of embroidery. The computational complexity of these techniques makes them impractical for interactive scenarios. The model-and-color approach may take several hours to generate a single frame. While such latency may be suited for generating computer graphics used in film-making, such latency would be unacceptable in an application for real-time rendering on a website.

One way to circumvent the aforementioned issues is to employ a data-driven approach. In such an approach, individual stitches of all conceivable lengths, colors, rotations, lighting positions, etc. are photographed and the images stored in a large database. To produce an embroidery image, the appropriate images are selected from the database and composited together as if making a collage. Since each stitch in the image is taken from an actual photograph, all the subtleties of lighting are pasted directly into the output image without any need for mathematical modeling or simulation. Such an approach follows some more recent trends in computer graphics which leverage the increasing ubiquity of high-quality capture devices (e.g., digital cameras and scanners) and the exponential growth of memory and storage on modern computers. While this might be a nice idea in theory, it is obviously impractical to capture and store every conceivable permutation of length, color, rotation, lighting position, etc.

It would therefore be desirable to have a technique for automatically rendering a more realistic image of an embroidered design without the traditional rendering latency.

SUMMARY OF THE INVENTION

In an embodiment, a method for rendering a simulated embroidery design image includes obtaining a plurality of stitch representations for an embroidery design, obtaining a lighting angle for the simulated embroidery design image, and processing at least a plurality of the stitch representations, the processing comprising the steps of, for each processed stitch representation, determining a stitch length, selecting from a stitch image database a stitch image corresponding to the stitch length such that when placed on a rendering canvas in a position corresponding to a stitch position, the selected stitch image will appear to be illuminated at the selected lighting angle, and placing the selected stitch image on the rendering canvas in a position corresponding to the stitch position.

In another embodiment, non-transitory computer readable memory tangibly embodies program instructions which, when executed by a computer, implement a method for rendering a simulated embroidery design image. The method includes the steps of obtaining a plurality of stitch representations for an embroidery design, obtaining a lighting angle for the simulated embroidery design image, and processing at least a plurality of the stitch representations, the processing comprising the steps of, for each processed stitch representation, determining a stitch length, selecting from a stitch image database a stitch image corresponding to the stitch length such that when placed on a rendering canvas in a position corresponding to a stitch position, the selected stitch image will appear to be illuminated at the selected lighting angle, and placing the selected stitch image on the rendering canvas in a position corresponding to the stitch position.

In yet another embodiment, non-transitory computer readable storage tangibly embodies a simulated embroidered design image that includes a plurality of individual stitch images appearing to be illuminated at a particular lighting angle. Each of the plurality of individual stitch images corresponds to a stitch representation in a corresponding embroidery design having a plurality of stitch representations from which stitch position and stitch rotational angle is determinable.

In still another embodiment, a system for rendering an embroidery design image includes one or more processors configured to receive a lighting angle for the simulated embroidery design image and a plurality of stitch representations for an embroidery design, and to process each stitch representation to determine a corresponding stitch length, select from a stitch image database a stitch image corresponding to the stitch length such that when placed on a rendering canvas in a position corresponding to a stitch position, the selected stitch image will appear to be illuminated at the selected lighting angle, and to place the selected stitch image on the rendering canvas in a position corresponding to the stitch position.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 4A-4D illustrate rotation of an object in physical space and the resulting lighting effects.

FIG. 5 illustrates rotation of an image of an object.

DETAILED DESCRIPTION

Figure 1:
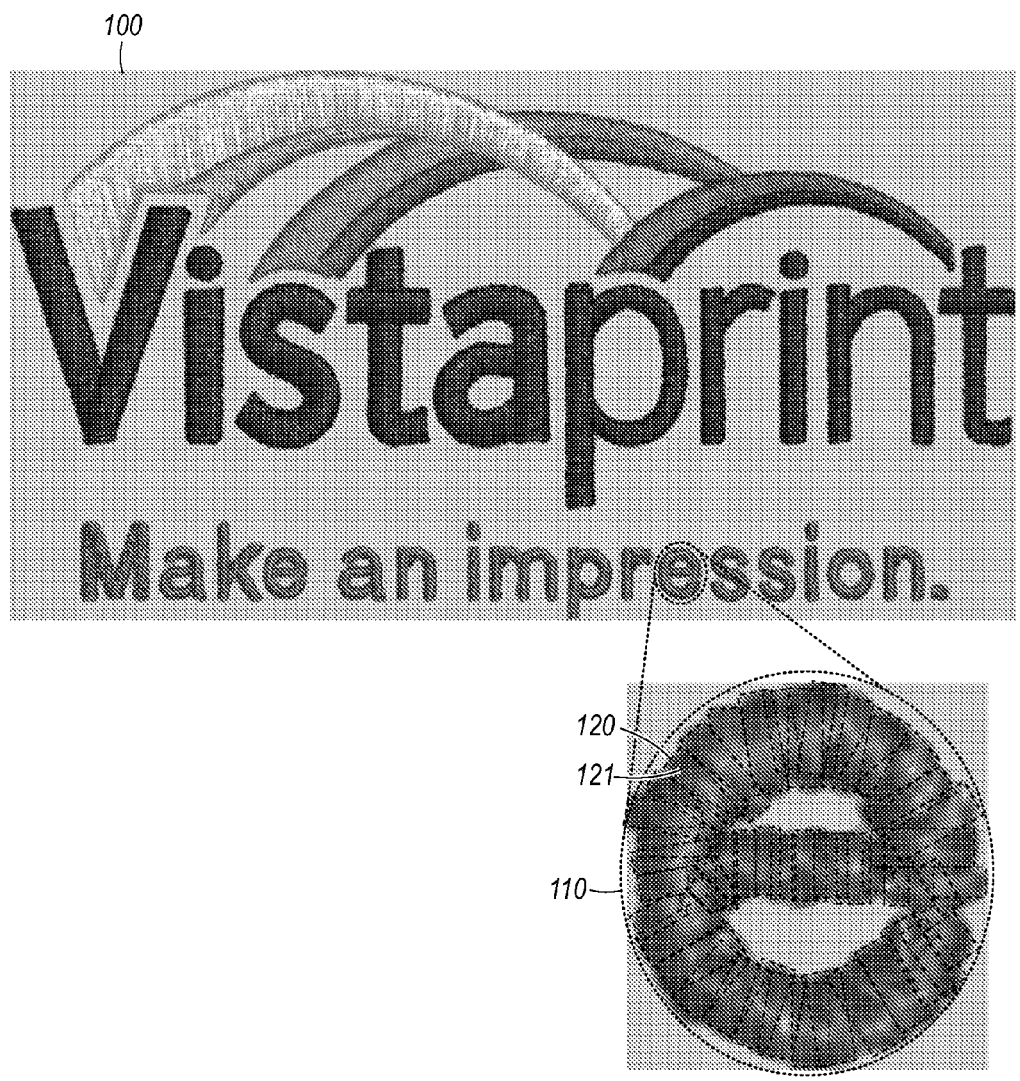
FIG. 1 illustrates an example of an exemplary simulated embroidered design image rendered in accordance with embodiments of the invention

Embodiments of the invention described herein employ a novel hybridization of the model-based and data-driven approaches described in the background section. In particular, embodiments of the invention utilize a parametric approach to texture mapping. Many of the design choices in the embodiments herein described are specific to embroidery visualization and yield results superior to those attainable by existing techniques. The performance of the system is suitable for use in interactive applications.

In order to facilitate a better understanding of the invention, a brief introduction to the embroidery process is first presented. In industrial embroidery applications, embroidery is typically produced using a motorized sewing mechanism combined with a synchronized movable frame that holds material to be embroidered underneath the sewing needle. As the sewing needle is moved up and down, the movable frame may be precisely shifted in x,y coordinate space via two stepping motors that are directed by a special purpose microcontroller. The length and direction of each stitch is specified by the x,y position of the frame for each of the two needle penetrations that compose the stitch. In this way, various types of stitching may be recreated at arbitrary locations on material within the frame. Embroidery data used as input to such a machine typically consists of a series of x,y coordinates specifying the locations at which stitches (i.e., needle penetrations) should be placed. Stitch length and a rotational angle of the stitch relative to a predefined zero rotation can be determined based on the relative coordinates of the two needle penetrations.

There are two traditional ways to store embroidery data in a file. Wireframe formats typically include a set of wireframe primitives that describe regions using control points and specify properties about how that region should be stitched. An example of a wireframe primitive might be an area that should be stitched using a fill stitch with a given density and stitch angle. This higher-level wireframe primitive can then be converted into individual stitch representations by a stitch engine. Another traditional method for representing embroidery design data is using a stitch-based format which specifies individual stitches or needle impressions. This is the format that is usually required by an embroidery machine. An instruction in a stitch-based format might be represented as "place needle at (2,3), place needle at (5,4), trim, change color, place needle at (3,3), place needle at (6,5), trim . . . ". If the file specifies needle impressions or stitch points, then the points usually have a type associated with them such as stitch, needle up, or trim.

In accordance with embodiments of the invention, an embroidery rendering technique based on a parametric texture model is utilized to render embroidery designs based on stitch representations. In other words, given a start point, an end point, and a color for each stitch representation in a design, an embroidery design renderer in accordance with embodiments of the invention quickly draws a simulated image of an embroidery design that appears highly real.

Referring now to FIG. 1, there is illustrated an exemplary image 100 of a simulated embroidered design image. Each individual stitch in the design is rendered as a rectangle primitive 120 textured with an appropriate image 121 of a stitch. The rendering technique employs texture mapping at the individual stitch level, and selects appropriate textures for each stitch based on the length and rotation of the stitch and the lighting angle of the source light.

Figure 2:
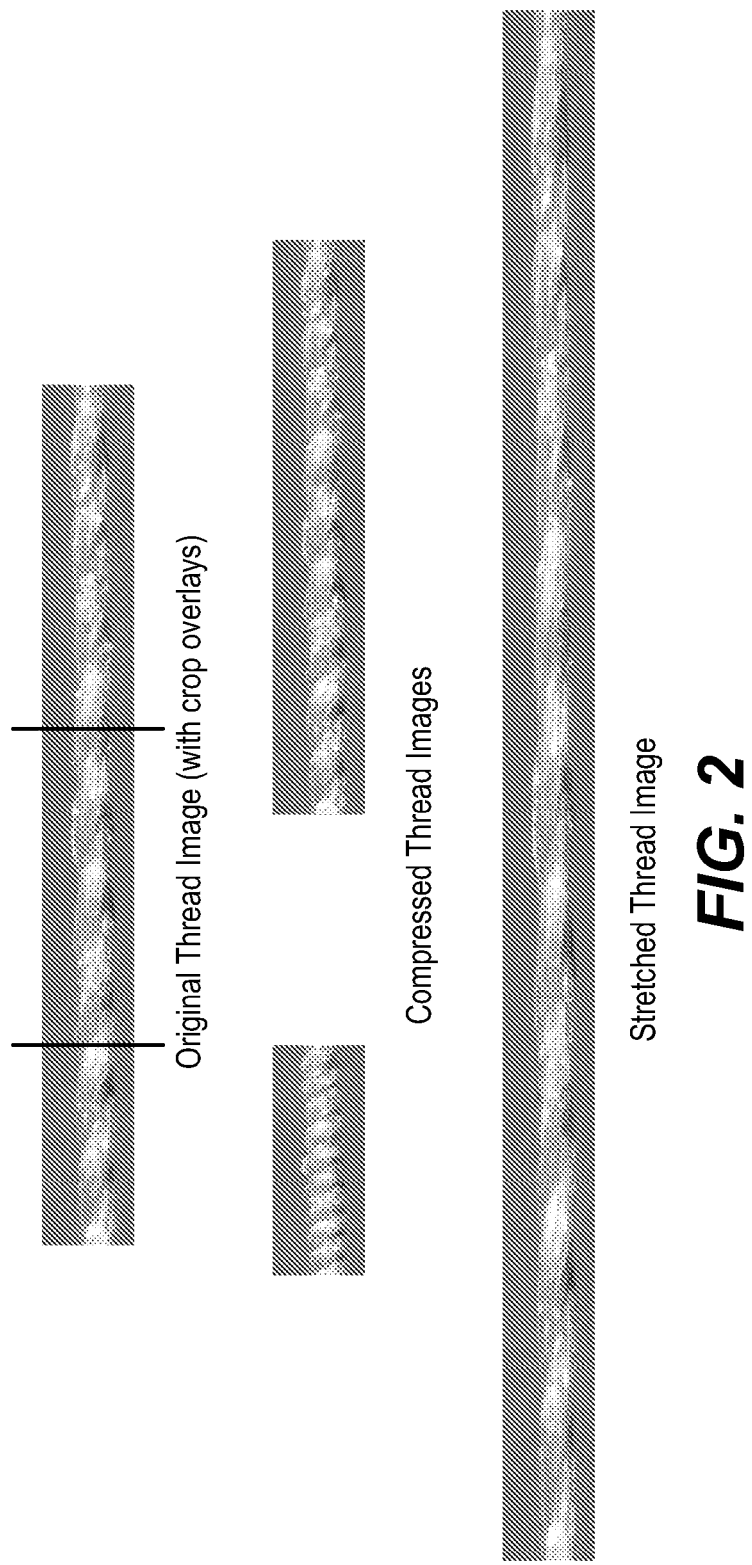
FIG. 2 illustrates various thread images, illustrating the effects of compressing, stretching, and cropping an original thread image.

The parametric texture model is based in part on texture mapping. Texture mapping is the act of taking an image, and placing it on top of some sort of simple graphics primitive. Drawing the rectangle primitives corresponding to the positions of the stitches is a straight-forward procedure that is well-known in the art. However, obtaining and selecting a texture that realistically simulates an actual embroidery stitch presents greater challenges and has not heretofore been achieved. While one might consider simply stretching, compressing, or cropping an image of an individual thread to fit the rectangle primitives, as illustrated in the examples shown in FIG. 2, the resulting simulated embroidery image does not realistically represent how the embroidered design will appear when physically stitched. First, since threads internally have twists, the image looks unrealistic if it stretched by any significant amount. Second, if an image of a thread is cropped, the middle section may accurately represent the middle portion of an actual stitch, but the ends appear obviously cut off since the stitch penetrations into the fabric are not simulated and do not have the correct lighting.

Figure 3:
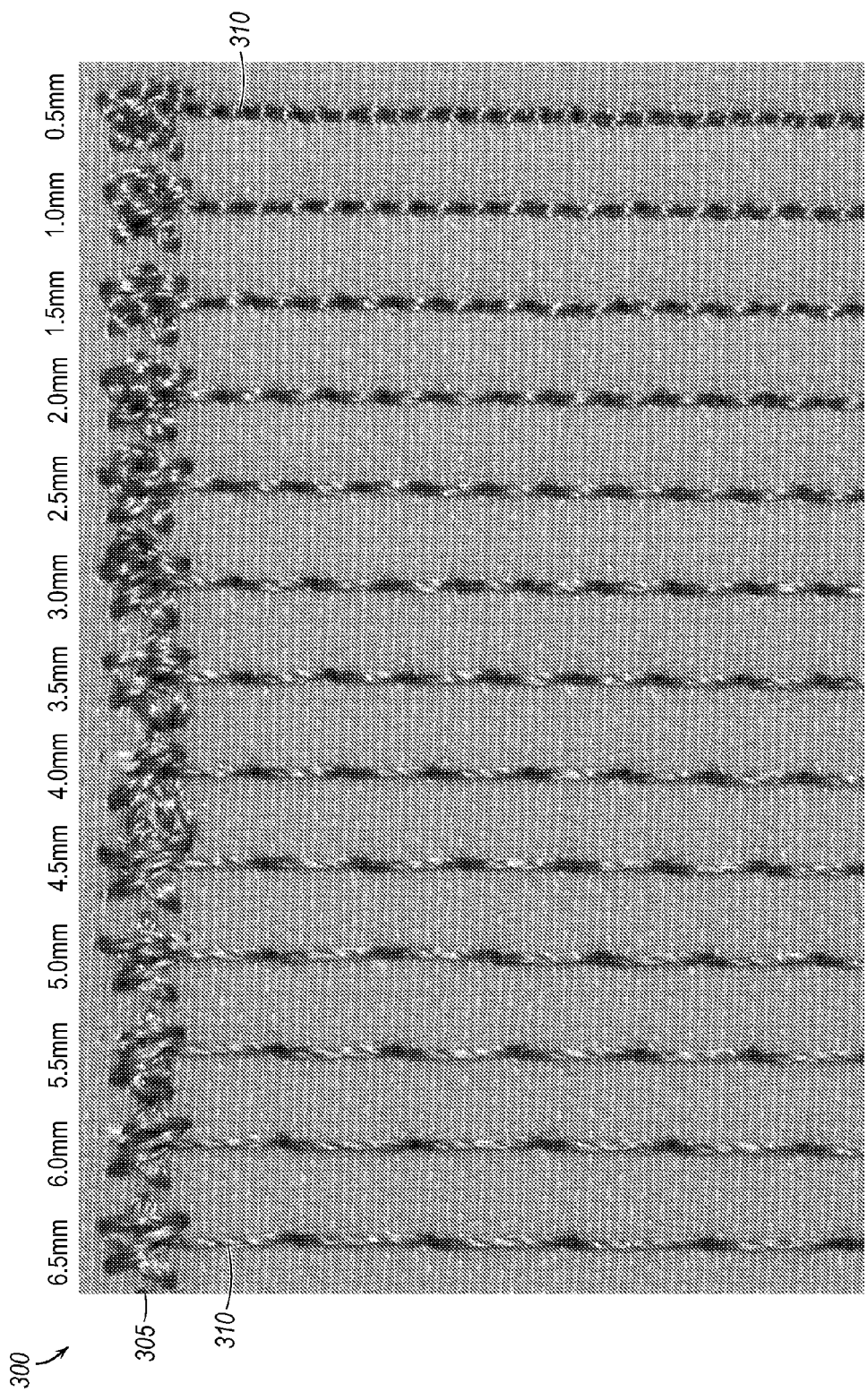
FIG. 3 shows an exemplary embodiment of a stitch palette for use in acquiring stitch images.

In embodiments of the invention, images (i.e., photographs) of stitches at various lengths are obtained. FIG. 3 shows an image 300 of a palette 305 containing multiple stitches 310 of various lengths. Individual stitch images 310 can be extracted from the image 300, for example by cropping the areas of the image 300 surrounding a stitch 310 of interest. In the example shown, each stitched column contains stitches of the same length, and the stitch length is different between columns. As seen in the image, the start and end of each stitch is visible—notice how it gets darker at the endpoints where the stitch penetrates the fabric. Thus, texturing the rectangles using images of real stitches, including the start and end points, greatly improves the realism of the rendered design.

An embroidery design renderer in accordance with embodiments of the invention render the stitches of the embroidery design using texture mapping with images of actual stitches, for example stitches that are selected from the image of FIG. 3. First, a rectangle primitive corresponding to the length and width of each stitch is generated and placed on the rendering canvas (i.e., an area on a display screen), and a corresponding stitch image having a length (in pixels) that is closest to the size of the rectangle that is to be textured is obtained and used as texture for the corresponding rectangle primitive associated with the stitch being rendered.

In the image shown in FIG. 3, all of the stitches are oriented in the same direction and are illuminated by the same light source and thus at the same lighting angle. Notably, stitches of the same length and rotation (relative the light source) have very similar lighting effects. In embroidery, however, the stitches of a design may be oriented at different rotational angles relative to the light source and to one another. The lighting angle and thus the lighting effects such as illumination and shadowing are independent of the rotation of the stitches. For example, referring to FIGS. 4A-4D, if one observes an object 400 (such as the Arrow) in real space that is illuminated from above left, one will observe illuminated areas 402 near the above-left of the object and shadows 404 cast below-right the object 400 no matter what the rotation of the actual object 400. For example, the Arrow object 400 is rotated pointing up at 0° in FIG. 4A, rotated to 90° in FIG. 4B, 180° in FIG. 4C, and 270° in FIG. 4D. At each rotation of the object 400, the illuminated areas 402 are generally at the upper left and the shadows are generally toward the lower right.

In physical space, individual embroidery stitches may be stitched at many different rotations in a single design, as illustrated at 110 in FIG. 1, and the lighting effects (e.g., illumination, shadowing) may fall on different areas of differently oriented stitches. When using texture mapping to render a design having stitches oriented at different rotational angles, the renderer must account for the fact that the imaged lighting effects will rotate with the image of the stitch, which would not be case when an actual physical stitch is rotated relative a light source. For example, if a photograph were to be taken of the Arrow object 400 with the object and light source oriented as shown in FIG. 4A, and then the photograph were rotated by 90°, as shown in FIG. 5, the illumination areas 402 and shadowing 404 have also rotated by 90°. As shown in FIG. 5, the illumination areas 402 are more toward the upper right (instead of upper left) and the shadow areas 404 appear at the lower left (instead of lower right). Thus, the rectangle primitive of a rotated stitch cannot be textured by merely rotating an image of a stitch taken at a different stitch rotation with the same lighting angle. Accordingly, when a stitch is rotated relative to the light source, the renderer should texture the corresponding rectangle primitive with an image of the stitch taken at a lighting angle corresponding to the relative lighting angle between the light source and the rotated stitch. This requires multiple stitch images taken from different lighting angles.

Figure 6:
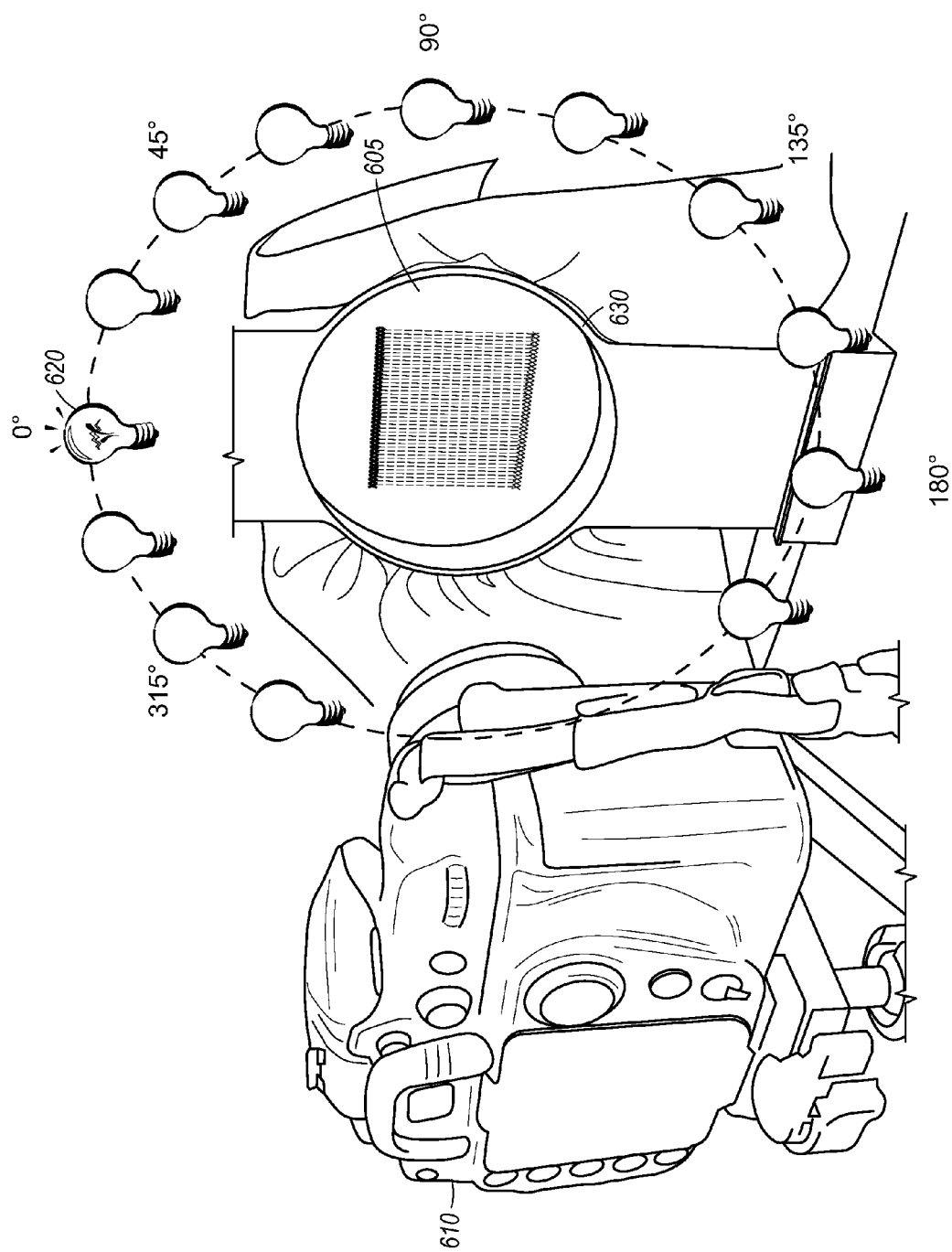
FIG. 6 is a diagram illustrating a set up for acquiring stitch images.

In an embodiment, images of multiple stitches for each of multiple different stitch lengths are obtained over a plurality of different source light angles. FIG. 6 graphically illustrates one technique for collecting the required images. As illustrated, a camera 610 is positioned a fixed distance in front of a hooped stitch palette. The palette 605 is a textile stitched with one or more stitches, such as 305 in FIG. 3, and is framed in a hoop 630. In an embodiment, the palette implements green stitches on a red substrate. These colors are preferable as they are very distinct for good decomposition (just like green-screen or blue-screen video). An off-camera light source 620 is rotated around the palette in increments (such as 16°) over a full 360° rotation. Individual stitches (such as 310 shown in FIG. 3) can be extracted from the photographs and inserted into a database containing individual stitch images of different stitch lengths and different lighting angles.

Figure 7A:
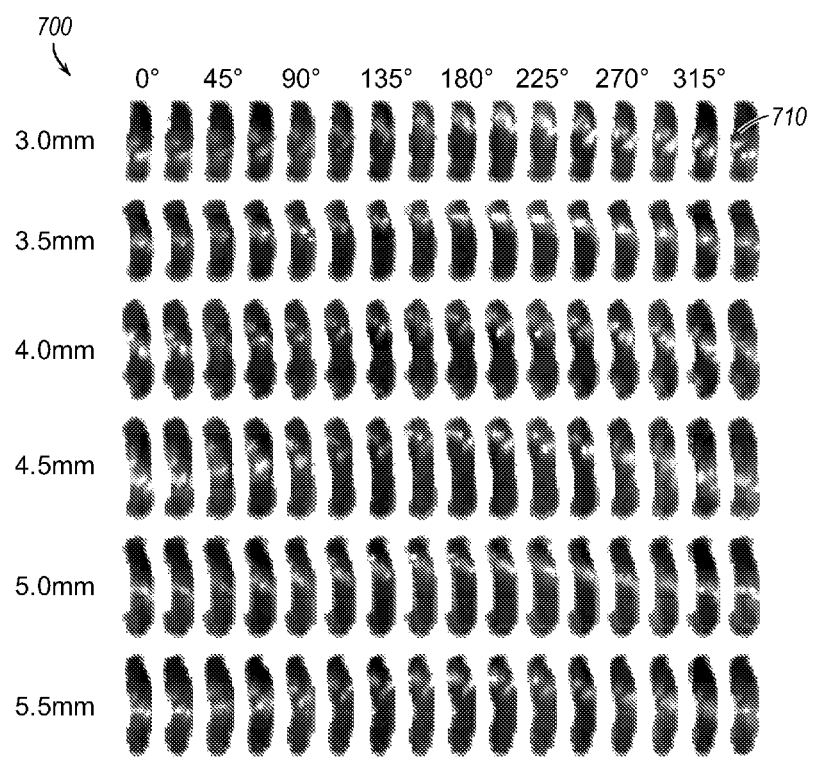
FIG. 7A-7D show an exemplary stitch database indexed by stitch length and lighting angle, and together illustrate how a stitch image is selected by the embroidery design renderer.
Figure 7B:
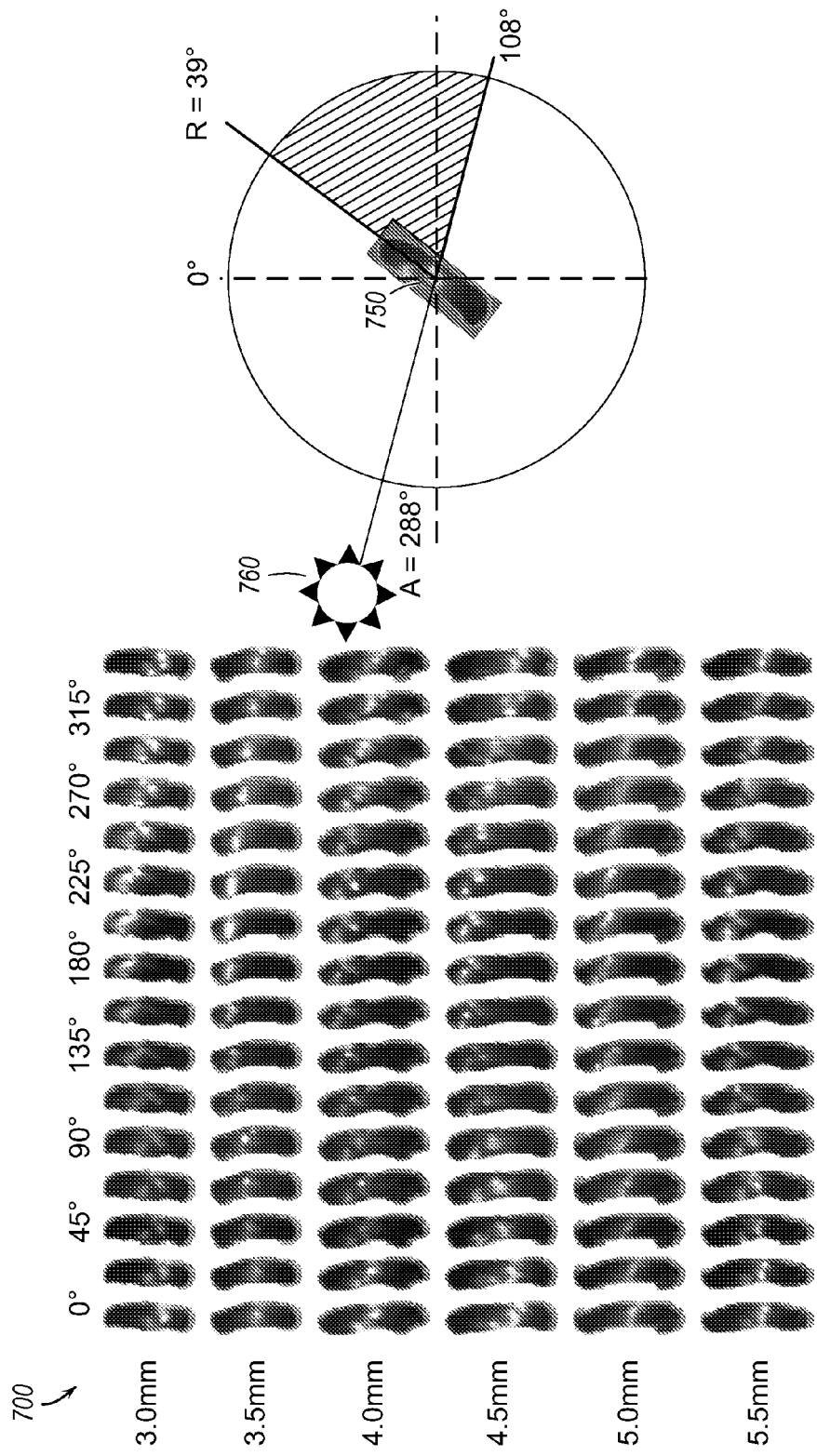
Figure 7C:
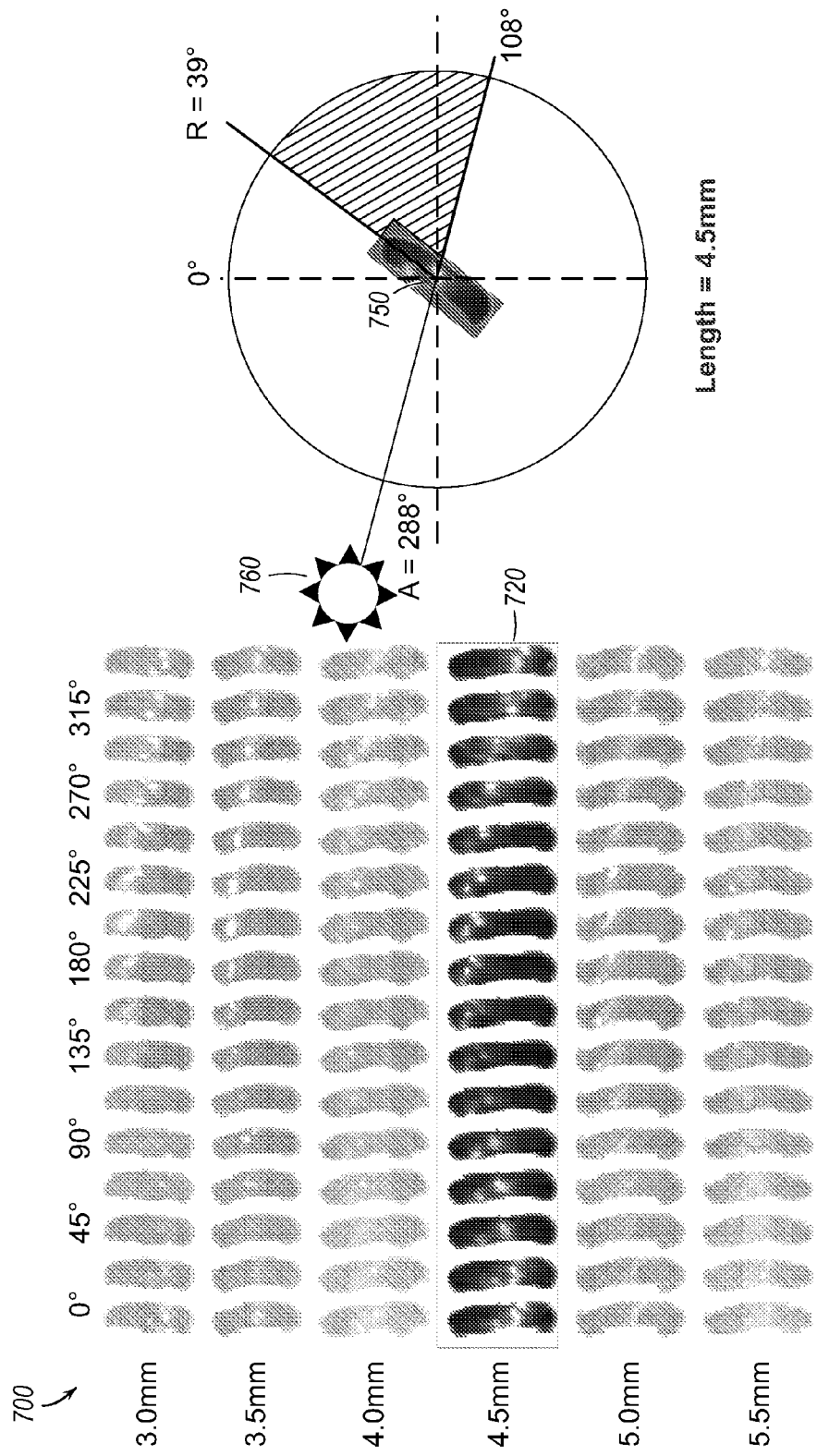
Figure 7D:
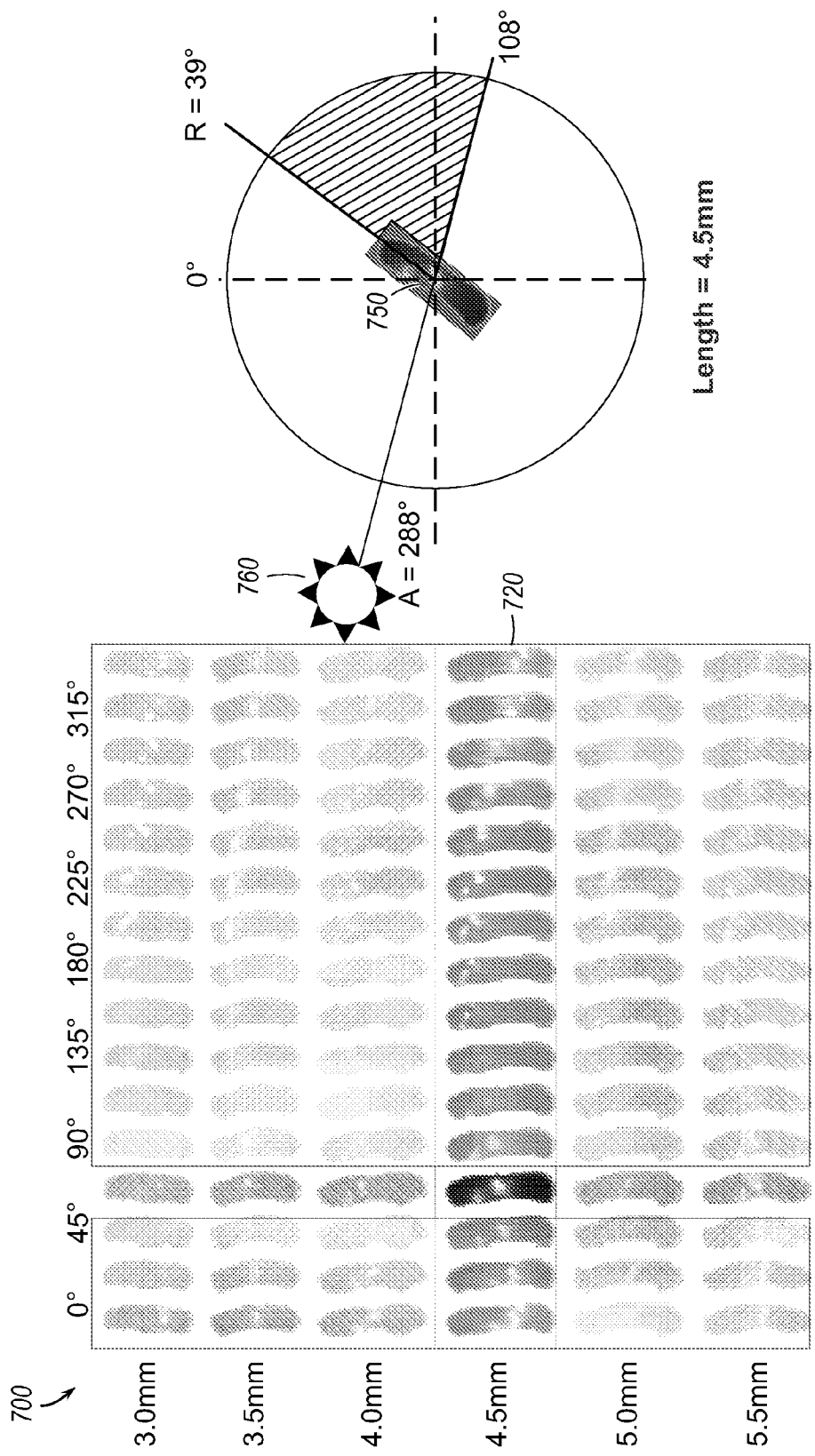

FIG. 7A shows a collection of stitch images arranged in rows by stitch length and columns by source lighting angle. Indexing the images in this manner allows simple selection of appropriate stitch textures for use in texture mapping an embroidery design. FIGS. 7B-7D illustrate how to select an appropriate texture image from a stitch image database 700 for a stitch having a rotational angle R that is to be rendered on a rendering canvas with a source light having a source light positioned with azimuth angle A such that illuminates the stitch 750 at illumination angle, I, where I=A−180°.

FIG. 7B shows an example stitch 750 having a stitch angle of R=39° (relative to 0° at vertical) and the desired or predetermined source light coming from the upper left having an azimuth A=288°. To select a suitable stitch image to use as texture for this stitch 750, the length of the stitch 750 is computed. This length of the stitch can be computed from the start $(x_1, y_1)$ and end $(x_2, y_2)$ coordinates in the stitch representation using standard trigonometry. That is, $L=((x_2-x_1)^2+(y_2-y_1)^2)^{1/2}$. In this example, we will assume that the length, L, of the stitch is computed to be L=4.4 mm. While ideally the stitch database would contain every stitch length and every lighting angle, in practice a reduced set of stitch lengths and lighting angles will be utilized, yet will still result in a very real-looking simulated embroidery image. Returning to our example, rounding the computed stitch length L to the nearest 0.5, that means that a texture should be selected from the row of 4.5 mm stitches, indicated in FIG. 7C at 720.

To select the stitch in the 4.5 mm row representing the correct lighting angle for stitch 750, the rotational angle, R, is first determined. Again, this can also be calculated from the stitch coordinates using standard trigonometry—that is, $R=\sin^{-1}((x_2-x_1)/((x_2-x_1)^2+(y_2-y_1)^2)^{1/2})$. For purposes of this illustration, assume $R=39°$. Furthermore, it is seen in FIGS. 5B-5D that the direction of the light (i.e., the illumination angle, I) is to the lower right. That is, since in this illustration the source light is positioned having an azimuth $A=288°$, the direction of the light shining on the stitch is defined by the illumination angle $I=A-180°$, or $108°$. The relative lighting angle, RAL, is then computed as the difference between the illumination angle, I, and the stitch rotational angle, R. In the current example, $RAL=I-R=108°-39°=69°$. The column in the stitch image database 700 corresponding to a lighting angle closest to the computed relative lighting angle may then be selected, as illustrated at 730 in FIG. 5D. In an embodiment, to add further realism, multiple images of different stitches of the same length and lighting angle are collected and usable as an appropriate texture for a stitch of corresponding length and lighting angle. When the desired stitch length and lighting angle are determined, one of the multiple images having the same stitch length and lighting angle may be selected at random, or according to a selection algorithm, to add variability to the rendered image—thus, not all stitches having the same stitch length and lighting angle appear exactly the same in the simulated embroidery design image.

Upon selection of a suitable stitch image having the correct length and lighting angle from the image database 700, the embroidery design renderer textures the rectangle primitive 120 with the selected stitch image 121, as best shown at 110 in FIG. 1.

This process is repeated for all the stitch representations in the embroidery design, and results in a very real-looking simulated embroidery design image.

In an embodiment, the image database 700 may contain images of stitches taken at not only at varying stitch lengths and lighting angles, but also using different thread colors. The image database 700 would then be further indexed (along a third dimension, not shown), by color.

In an alternative embodiment, the stitch images may be taken of thread of a known color, and then the color can be changed to the specified stitch color via color transformation algorithms. For example, in an embodiment, the thread color in a selected stitch image may be transformed from one color to another using the well-known Phong shading algorithm, described in Bui Tuong Phong, "Illumination for Computer Generated Pictures," Comm. ACM, Vol. 18(6):311-317, June 1975, which is incorporated by reference herein for all that it teaches.

The texture is formed by the combination (overlay) of different channels. These texture coordinates index a specially prepared image file that contains different coefficients for a Phong-like shader. The components that are combined are the color channel, ambient channel, diffuse coefficient, and specular coefficient. The embroidery design renderer 800 receives the stitch length and lighting angle, and produces a 3-channel RGB texture which contains (per pixel):

Alpha transparency (in the red (R) channel)

The diffuse coefficient (in the green (G) channel)

The specular coefficient (in the blue (B) channel)

The texture is produced by indexing the stitch length and lighting angle to a corresponding stitch image having the nearest stitch length and lighting angle in a database of stitch images of varying stitch lengths taken at varying lighting angles, retrieving the corresponding stitch image, and positioning the retrieved stitch image on a rendering canvas in a position specified in the stitch file.

In an embodiment, each individual stitch is rendered as a rectangle. Texture coordinates within each rectangle, ranging from $0 \le u \le 1$ and $0 \le v \le 1$, are used to index the aforementioned stitch images which comprise, at each pixel, coefficients for a Phong-like shader. These coefficients (diffuse and specular) are combined with the color channel and ambient channel to determine the pixel color in the resulting image.

The diffuse and specular coefficients from the texture (i.e., the stitch image) are the geometry-dependent terms in the Phong shading equation. These are computed from the actual stitch image, on a pixel-by-pixel basis, which differs substantially from the traditional computer graphics approaches (such as described in the '283 Publication discussed in the background section) which determine these coefficients based on shape information (e.g., full 3D models or surface normals for bump mapping).

The diffuse coefficient combined with the color channel provides the general shading for the stitches. It gets the general idea across, but does not have the sparkle of real thread. Adding specular highlights produces the look of reflected light. Preferably, this combination should be performed in linear gamma (1.0) instead of display gamma (typically 1.8 or 2.2). The ambient channel accounts for some global illumination and subsurface scattering effects (since the threads are translucent).

The color of a given pixel in the stitch image is affected by the diffuse component, D, which is the component affected by the observed color, and the specular component, S, which depicts the reflection of the light. In order to change the observed color of the pixel, it is desired to only modify the diffuse component, D, while keeping the specular component, S, the same. This can be done using the Phong shading algorithm, which generally says that the observed pixel color is some additive combination of the diffuse and specular color—or, observed pixel $P=aD+bS$, where a and b are constants. The unknown constants a and b can be solved for using linear algebra. For example, suppose D is diffuse color and S is specular color. If D and S are RGB (Red, Green, Blue display channels), we can solve for the unknowns. For example, suppose $D=\{1.0, 0.0, 0.0\}$ and $S=\{1.0, 1.0, 1.0\}$. Then, if $P=\{0.8, 0.4, 0.4\}$ then $a=0.4$ and $b=0.4$, and if $P=\{0.1, 0.0, 0.0\}$ then $a=0.1$ and $b=0.0$. To change the color of the diffuse component to $D_{new}$, we solve for a and b, and then set $P_{new}=aD_{new}+bS$. Since the thread color and light color is known at the time the images are acquired, we can solve for a and b and store this as the texture. For example, if the threads are green and the light is white when the images are taken, we can solve for the diffuse and specular components and store these components for later transformation to different colors. To transform to a different color, one can multiply the thread colors by the diffuse image and add in the specular component.

In the embodiment discussed above, the embroidery design renderer selects a stitch image having a stitch length and lighting angle that most closely corresponds to the stitch length and lighting angle of the stitch to be rendered. If a stitch image having an intermediate lighting angle were desired, images corresponding to the two closest lighting angles could be selected and the pixel values could be linearly interpolated only if the desired color is that of the actual images. To produce a thread of a different color, as discussed above, it is not sufficient to just tint the image due to the existence of specular highlights, and it would therefore be necessary to separate out the components of the image. This is solvable given the known RGB color values of the thread ($[t_r t_g t_b]$=green), cloth ($[c_r c_g c_b]$=red), and light ($[l_r l_g l_b]$=white). According to the Phong shading model (and ignoring the contribution of ambient light), the observed pixel color $[p_r p_g p_b]$ can be computed from the (yet unknown) diffuse coefficients cloth/thread and specular coefficient for the light.

$$\begin{bmatrix} c_r & t_r & l_r \\ c_g & t_g & l_g \\ c_b & t_b & l_b \end{bmatrix} \begin{bmatrix} k_c \\ k_t \\ k_l \end{bmatrix} = \begin{bmatrix} p_r \\ p_g \\ p_b \end{bmatrix}$$

This can be solved easily using matrix inversion. Also, it is important to note that this decomposition only works in linear gamma space.

Figure 8:
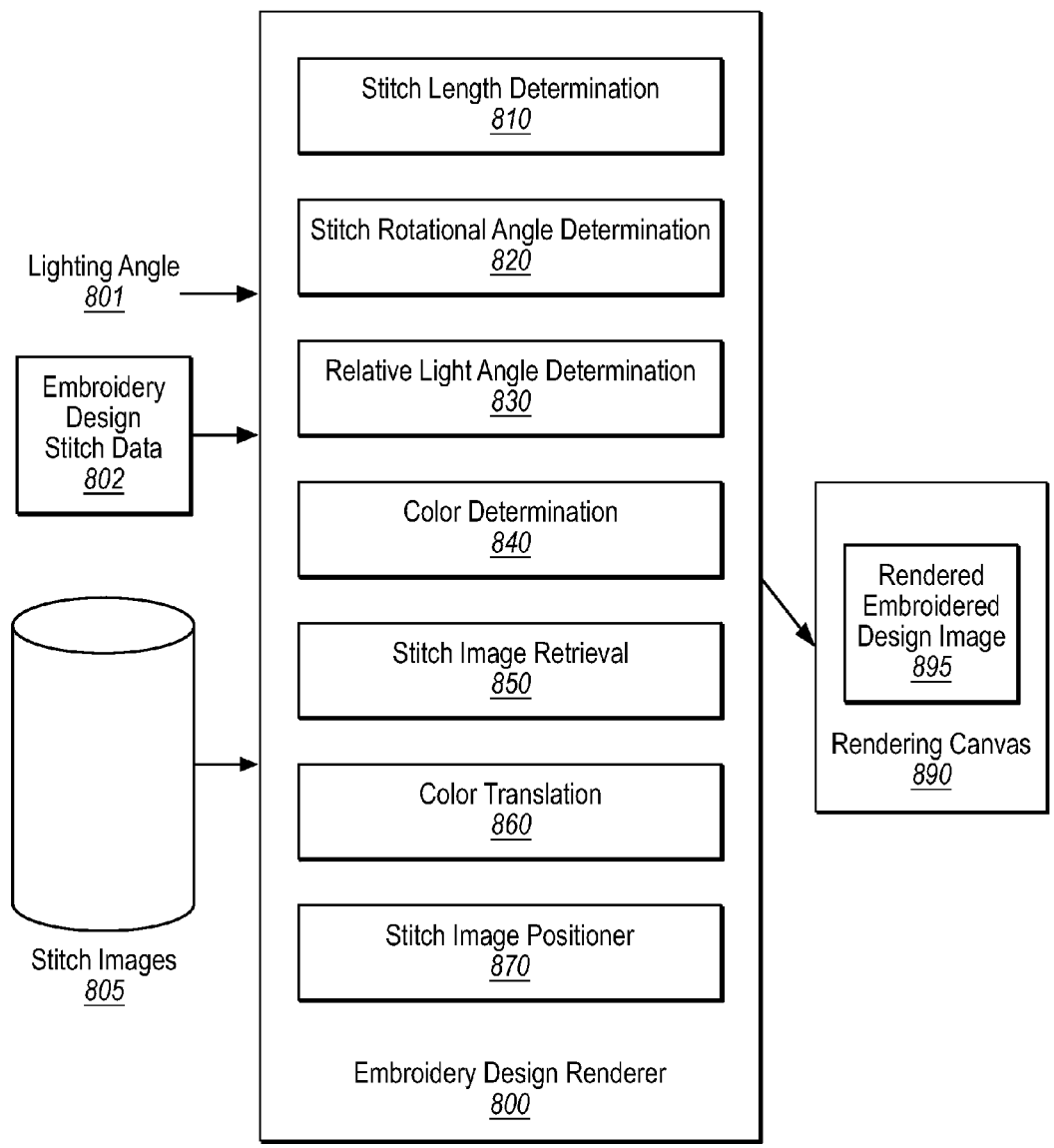
FIG. 8 is a block diagram of an exemplary embroidery design renderer.

Referring now to FIG. 8, a block diagram depicting a computer system for processing of embroidery stitch data by the embroidery design renderer 800 in accordance with a preferred embodiment of the present invention is shown. It should be understood that the methods and systems exemplified in embodiments described herein apply equally to any computer system, regardless of whether the computer system is a complex multi-user computing system or a single user device such as a personal computer, workstation, laptop, notepad, tablet, personal digital assistant (PDA), cellular phone, or other such device.

Generally, the embroidery design renderer 800 receives a lighting angle 801 from which the illumination angle can be determined. In an embodiment, this is the azimuth of the light source. In an alternative embodiment, the lighting angle is the actual illumination angle. The embroidery design renderer also receives embroidery design stitch data 802 typically in the form of a stitch file containing one or more stitch representations from which the length, color, rotation, and position of each stitch of the design is determinable. The embroidery design renderer 800 processes each stitch representation from the embroidery design stitch data 802. A number of components of the embroidery design renderer 800 process each stitch representation in the embroidery design stitch data 802. The embroidery design renderer 800 includes a Stitch Length Determination component 810, a Stitch Rotational Angle Determination component 820, a Relative Light Angle Determination component 830, a Color Determination component 840, a Stitch Image Retrieval component 850, a Color Translator component 860 (for some embodiments), and a Stitch Image Positioner component 870.

The Stitch Length Determination component 810 extracts the start and end coordinates from the stitch representation and determines the length of a stitch in display pixels (it is assumed that all stitches are the same width).

The Stitch Rotational Angle Determination component 820 determines the stitch angle relative a predetermined reference (e.g., vertical at 0°) based on the start and end coordinates extracted from the stitch representation.

The Relative Lighting Angle Determination 830 component 830 determines the relative lighting angle between the illumination angle (which is determined based on the input Lighting Angle 801) and the stitch rotational angle calculated by the Stitch Rotational Angle Determination component 820. In an embodiment, the Lighting Angle is the azimuth angle measured between a predetermined positional reference vector (i.e., a predetermined positional "North" coinciding with vertical or 0°) and the directional vector of a light source illuminating the stitch that is to be rendered (hereinafter referred to as the "azimuth angle"). The illumination angle is the angle of illumination, which is 180° from the azimuth. In an alternative embodiment, the Lighting Angle is simply the illumination angle itself.

The Color Determination component 840 extracts the thread color from the stitch representation.

The Stitch Image Retrieval component 850 accesses the Stitch Images database 805 and selects an appropriate stitch image using the calculated Stitch Length and Relative Light Angle as an index into the database. If the database includes images of different colored threads, the color is also used to index into the database.

If the database includes images of one thread color, only the Stitch Length and Relative Light Angle are used to index into the database, and the Color Translator component 860 translates the retrieved image to the desired color, for example using the Phong shading algorithm described previously.

The Stitch Image Positioner component 870 then places the retrieved image on a rendering canvas 890 in a position corresponding to a stitch position in the design as extracted from the stitch representation. In an embodiment, the rendering canvas 890 is an image file. In an alternative embodiment, the rendering canvas is a display screen.

Figure 9:
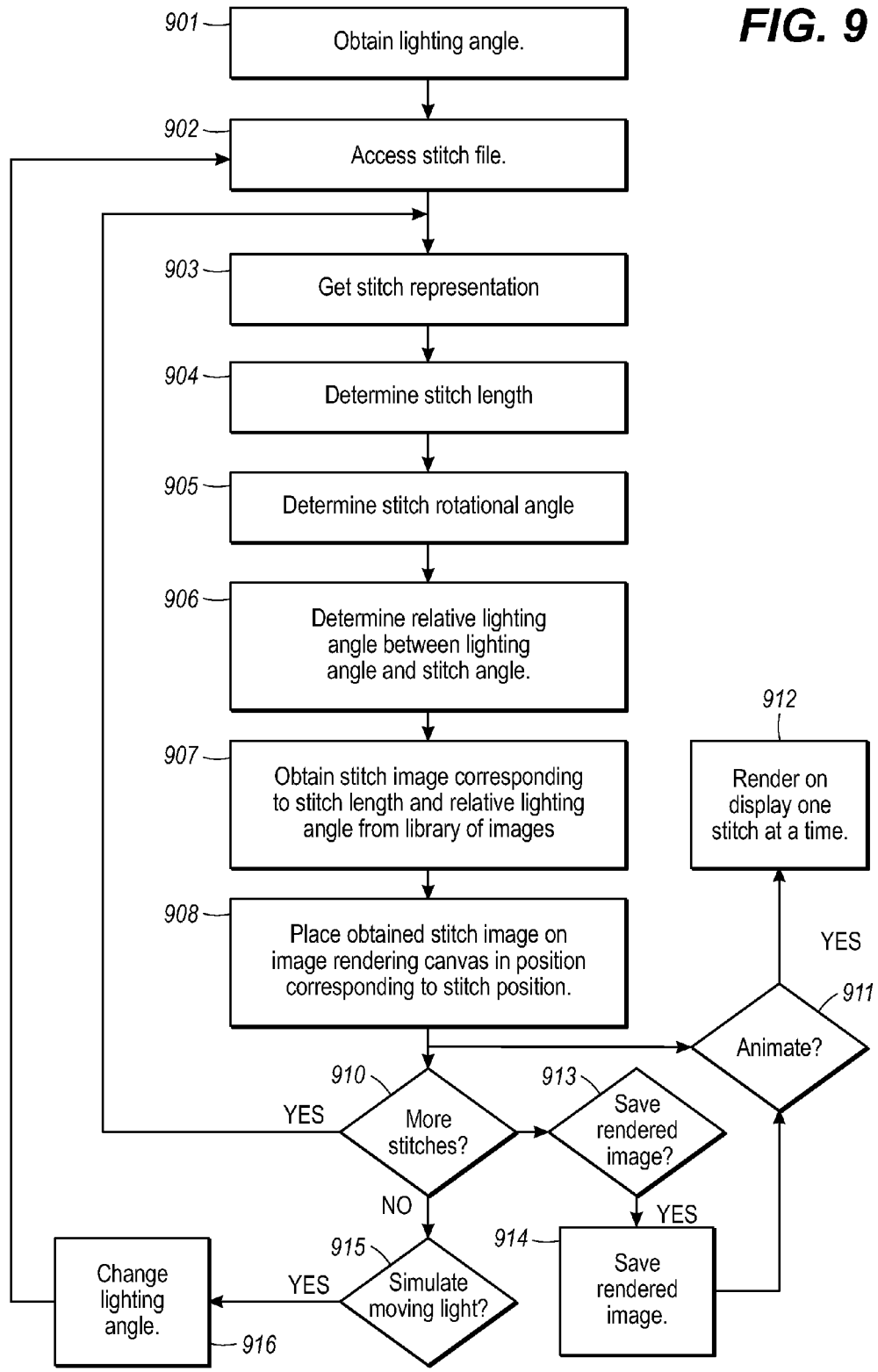
FIG. 9 is a flowchart of an exemplary method for rendering an embroidered image of an embroidery design.

A method of operation of an embroidery design renderer in accordance with an exemplary embodiment is illustrated by the flowchart illustrated in FIG. 9. As illustrated, the embroidery renderer obtains the lighting angle (step 901) and accesses a stitch file containing stitch representations for an embroidery design (step 902). The embroidery design renderer processes the stitch representations, one by one accessing the stitch representation (step 903), determining the stitch length (step 904), determining the relative lighting angle between the illumination angle and the stitch rotational angle (step 906), obtaining a stitch image from the stitch image database which corresponds to the determined stitch length and relative lighting angle (step 907), and placing the obtained stitch image on a rendering canvas in a position corresponding to stitch position in the embroidery design (step 908). Processing continues until all stitches are processed (step 910).

In an embodiment, the stitching can be rendered in real-time so that each stitch appears in order on a display screen in the order that it would be processed by the embroidery machine. Generating a slight delay between rendering each stitch on the display screen simulates an animation of the rendering (steps 911 and 912). The rendered image can be saved to an image file (steps 913, 914), which can presented all at once on a user's display screen, or can be uploaded to a requesting client for remote display.

In addition, animation of moving light can be simulated by rerendering the embroidery design using different lighting angles (steps 915, 916) and sequentially displaying the rerendered images on a display screen.

Figure 10:
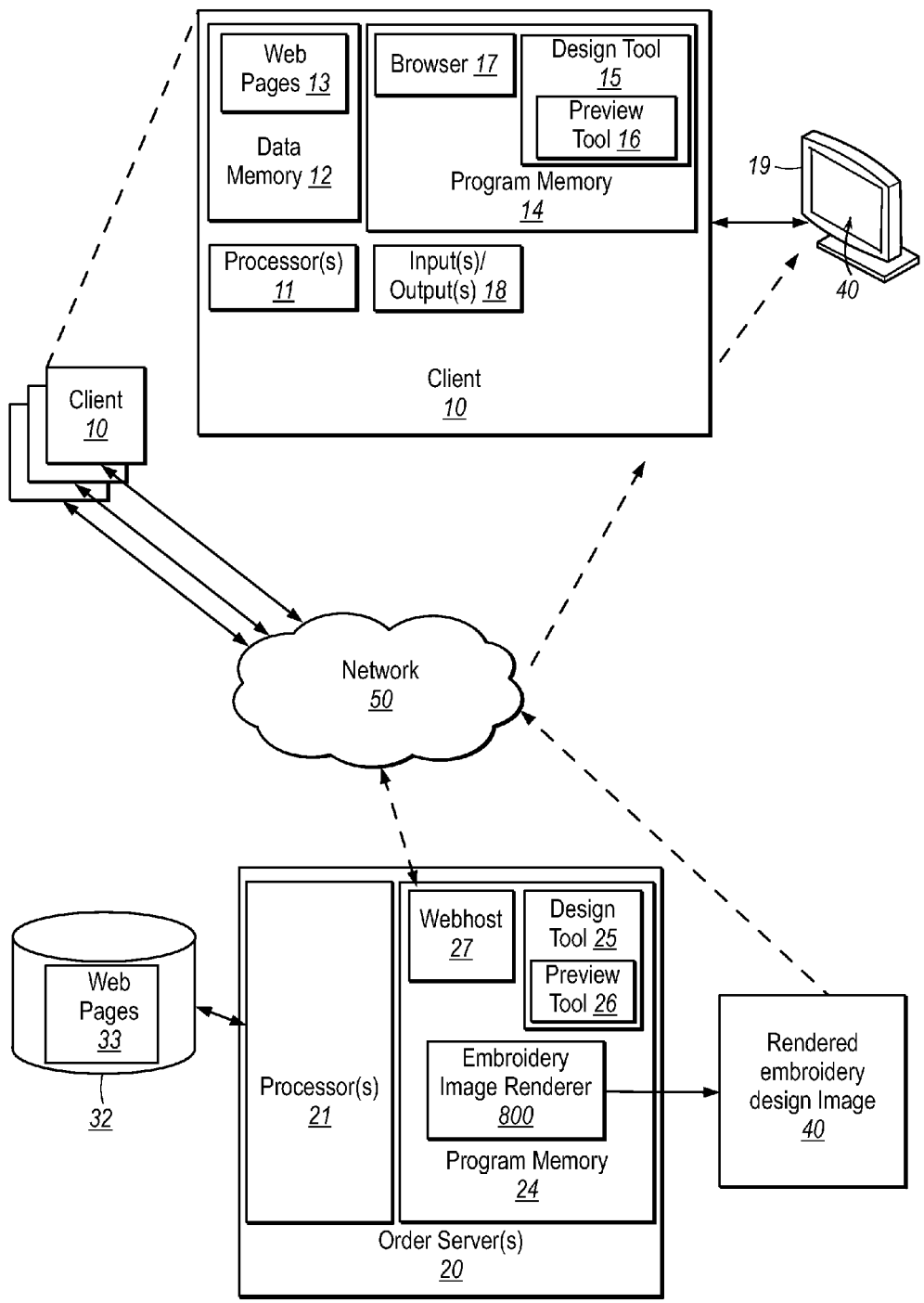
FIG. 10 is a block diagram of a networked system in which embodiments of the invention may operate.

FIG. 10 is a block diagram illustrating an exemplary system in which embodiments of the invention may operate. As illustrated, a client computer 10 includes one or more processors 11 that perform computation and control functions of the client computer system 10. Processor(s) 11 execute a design tool program 15 and may further execute a browser program 17. The design tool program 15 may execute within the browser program 17. The browser program 17 and design tool program 15 comprise program instructions stored in non-transitory computer readable program memory. The Browser program 17 may be used to access, via a network 50, a website hosted by a server computer system 20. Web pages 33 of a website may be stored in non-transitory computer readable memory 32 that is accessible to the server computer 20.

The server computer 20 also includes one or more processors 21 that perform computation and control functions of the client computer system 20. Processor(s) 21 execute a web-hosting program 27 that receives web page requests from client computer 10, retrieves requested web pages from memory 32, and sends the requested web pages to client computer 10. At least one web page may require the services of a design tool program 25, which may reside on the server computer 20 or may be uploaded to the client for execution by the client computer 10. The design tool program 25 may allow a client to select or input an embroidery design, which may already be in the stitch representation format required by embroidery machines, or which may be converted using a translation tool such as that described in U.S. Pat. No. 6,836,695 to Goldman, to the stitch representation format. The design tool 25 may include a preview tool 26, which communicates with an embroidery design renderer 800 residing on the server computer 20 to render a preview image 40 of the selected design. The preview image 40 may be saved in non-transitory computer readable storage at the server and transmitted via the network 50 to the client computer 10, where it is displayed on the user's display screen 19. Alternatively, individual rendered stitches can be sequentially sent from the server computer 20 to the client computer 10 and displayed on the client's display screen 19.

Those of skill in the art will appreciate that the invented method and apparatus described and illustrated herein may be implemented in software, firmware or hardware, or any suitable combination thereof. Preferably, the methods are implemented in software, and the apparatuses and systems are implemented using a combination of hardware and software for purposes of low cost and flexibility. Thus, those of skill in the art will appreciate that the method and apparatus of the invention may be implemented by a computer or microprocessor process in which instructions are executed, the instructions being stored for execution on one or more non-transitory computer-readable mediums and being executed by any suitable instruction processor or combination of instruction processors. Alternative embodiments are contemplated, however, and are within the spirit and scope of the invention.

What is claimed is:

1. A method for rendering a simulated embroidery design image, the method comprising the steps of:
    obtaining by one or more processors a plurality of stitch representations for an embroidery design, each of the plurality of stitch representations associated with a corresponding stitch position in the embroidery design which is to be rendered on a rendering canvas;
    obtaining by one or more processors a source light illumination angle for the simulated embroidery design image;
    processing by one or more processors at least a plurality of the stitch representations, the processing comprising the steps of
    for each processed stitch representation:
        determining a stitch length based on the corresponding stitch representation,
        determining a rotational angle of the corresponding stitch position in the embroidery design;
        determining a relative lighting angle between the source light illumination angle and the rotational angle of the corresponding stitch position,
        accessing a photographic stitch image database, the photographic stitch image database comprising a plurality of photographic stitch images, each photographic stitch image being a photograph of a single stitch of an associated known stitch length and illuminated from an associated known lighting angle, the photograph including an image of a thread penetrating an embroidery substrate at each of a first end and a second end, wherein the photographic stitch image database comprises at least some photographic stitch images associated with a same stitch length but different known lighting angles, and at least some photographic stitch images associated with a same known lighting angle but different stitch lengths,
        selecting from the photographic stitch image database a photographic stitch image most closely corresponding to the determined stitch length and the relative lighting angle, and
        placing the selected photographic stitch image on the rendering canvas in its corresponding stitch position of the embroidery design.

2. The method of claim 1, wherein the step of placing the selected photographic individual stitch image on the rendering canvas comprises:
    generating on the rendering canvas a rectangle primitive in a position corresponding to the corresponding stitch position of the embroidery design, and
    texturing the rectangle primitive with the selected photographic individual stitch image.

3. The method of claim 1, wherein the rendering canvas is a display screen of a computer.

4. The method of claim 1, wherein the rendering canvas is an image file.

5. The method of claim 1, further comprising sequentially displaying by one or more processors each selected photographic stitch image on the rendering canvas in its corresponding stitch position of the embroidery design.

6. The method of claim 1, further comprising performing by one or more processors, one or more iterations, the steps of obtaining a new source light illumination angle for the simulated embroidery design image and repeating the processing steps using the new source light illumination angle in place of the obtained source light illumination angle.

7. Non-transitory computer readable memory tangibly embodying program instructions which, when executed by a computer, implement a method for rendering a simulated embroidery design image, the method comprising the steps of:
    obtaining by one or more processors a plurality of stitch representations for an embroidery design, each of the plurality of stitch representations associated with a corresponding stitch position in the embroidery design which is to be rendered on a rendering canvas;
    obtaining by one or more processors a source light illumination angle for the simulated embroidery design image;
    processing by one or more processors at least a plurality of the stitch representations, the processing comprising the steps of
    for each processed stitch representation:
        determining a stitch length based on the corresponding stitch representation,
        determining a rotational angle of the corresponding stitch position in the embroidery design;
        determining a relative lighting angle between the source light illumination angle and the rotational angle of the corresponding stitch position,
        accessing a photographic stitch image database, the photographic stitch image database comprising a plurality of photographic stitch images, each photographic stitch image being a photograph of a single stitch of an associated known stitch length and illuminated from an associated known lighting angle, the photograph including an image of a thread penetrating an embroidery substrate at each of a first end and a second end, wherein the photographic stitch image database comprises at least some photographic stitch images associated with a same stitch length but different known lighting angles, and at least some photographic stitch images associated with a same known lighting angle but different stitch lengths, selecting from the photographic stitch image database a photographic stitch image most closely corresponding to the determined stitch length and the relative lighting angle, and placing the selected photographic stitch image on the rendering canvas in its corresponding stitch position of the embroidery design.

8. The non-transitory computer readable memory of claim 7, wherein the step of placing the selected photographic individual stitch image on the rendering canvas comprises:

generating on the rendering canvas a rectangle primitive in a position corresponding to the corresponding stitch position of the embroidery design, and texturing the rectangle primitive with the selected photographic individual stitch image.

9. The non-transitory computer readable memory of claim 7, wherein the rendering canvas is a display screen of a computer.

10. The non-transitory computer readable memory of claim 7, wherein the rendering canvas is an image file.

11. The non-transitory computer readable memory of claim 7, the method further comprising sequentially displaying each selected photographic stitch image on the rendering canvas in its corresponding stitch position of the embroidery design.

12. The non-transitory computer readable memory of claim 7, the method further comprising performing by one or more processors, one or more iterations, the steps of obtaining a new source light illumination angle for the simulated embroidery design image and repeating the processing steps using the new source light illumination angle in place of the obtained source light illumination angle.

13. Non-transitory computer readable storage tangibly embodying a simulated embroidered design image, the simulated embroidered design image comprising a plurality of individual photographic stitch images, each stitch image being a photograph of a single stitch of an associated known stitch length and illuminated from an associated known lighting angle, the photograph including an image of a thread penetrating an embroidery substrate at each of a first end and a second end, each of the plurality of individual stitch images corresponding to a stitch representation in a corresponding embroidery design, the embroidery design comprising a plurality of stitch representations from which stitch position and stitch rotational angle is determinable, wherein each respective individual photographic stitch image of the simulated embroidered design image is selected from a photographic stitch image database based on the known lighting angle of the respective individual photographic stitch image and the stitch rotational angle of the respective stitch representation in the embroidery design, and wherein the photographic stitch image database comprises at least some photographic stitch images associated with a same stitch length but different known lighting angles, and at least some photographic stitch images associated with a same known lighting angle but different stitch lengths.

14. A system for rendering an embroidery design image, comprising:

one or more processors which receive a source light illumination angle for the simulated embroidery design image and a plurality of stitch representations for an embroidery design, each of the plurality of stitch representations associated with a corresponding stitch position in the embroidery design which is to be rendered on a rendering canvas, the one or more processors processing each stitch representation to determine a corresponding stitch length based on the corresponding stitch representation, determine a rotational angle of the corresponding stitch position in the embroidery design, determine a relative lighting angle between the source light illumination angle and the rotational angle of the corresponding stitch position, access a photographic stitch image database, the photographic stitch image database comprising a plurality of photographic stitch images, each photographic stitch image being a photograph of a single stitch of an associated known stitch length and illuminated from an associated known lighting angle, the photograph including an image of a thread penetrating an embroidery substrate at each of a first end and a second end, wherein the photographic stitch image database comprises at least some photographic stitch images associated with a same stitch length but different known lighting angles, and at least some photographic stitch images associated with a same known lighting angle but different stitch lengths, select from the photographic stitch image database a photographic stitch image most closely corresponding to the determined stitch length and the relative lighting angle, and place the selected photographic stitch image on the rendering canvas in its corresponding stitch position of the embroidery design.

15. The system of claim 14, further comprising the photographic stitch image database, the stitch image database storing in non-transitory computer readable memory a plurality of photographic stitch images of embroidered stitches of varying stitch lengths and taken at varying lighting angles.

16. The system of claim 14, further comprising a server computer system which receives an embroidery design from a client computer and renders the plurality of selected photographic stitch images on the rendering canvas, the rendering canvas comprising an image file which may be sent to the client computer for display on a display screen of the client computer.

17. The system of claim 14, further comprising a server computer system which receives an embroidery design from a client computer and remotely renders the plurality of selected photographic stitch images on the rendering canvas in their corresponding respective stitch positions of the embroidery design on a display screen of the client computer.

18. The system of claim 14, further comprising a server computer which receives a lighting angle and a stitch length from a client computer, selects the photographic stitch image from the stitch image database, and sends the selected photographic stitch image to the client computer for rendering on a display screen at the client computer.

19. A method for rendering a simulated embroidery design image, the method comprising the steps of:

obtaining by one or more processors a plurality of stitch representations for an embroidery design, each stitch representation providing stitch information from which a stitch position, stitch length, stitch color, and lighting angle may be determined;

processing by one or more processors at least a plurality of the stitch representations, the processing comprising the steps of, for each obtained stitch representation, obtaining a photographic stitch image of an embroidery stitch having a known stitch length which corresponds to the stitch length of the obtained stitch representation, a known stitch color which corresponds to the stitch color of the obtained stitch representation, and a known lighting angle which corresponds to the lighting angle of the obtained stitch representation, each photographic stitch image being a photograph of a single stitch including a thread penetrating an embroidery substrate at each of a first end and a second end, and placing the obtained photographic stitch image on the rendering canvas in a position corresponding to the stitch position.

* * * * *